United States Patent
Uchiyama et al.

(10) Patent No.: US 6,372,630 B1
(45) Date of Patent: Apr. 16, 2002

(54) SEMICONDUCTOR DEVICE AND FABRICATION METHOD THEREOF

(75) Inventors: Tomoyuki Uchiyama; Kazuhisa Sasaki; Taro Muraki, all of Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/332,154

(22) Filed: Jun. 14, 1999

Related U.S. Application Data

(62) Division of application No. 09/039,454, filed on Mar. 16, 1998, now abandoned.

(30) Foreign Application Priority Data

Apr. 18, 1997 (JP) ............................................... 9-116321
Dec. 2, 1997 (JP) ............................................... 9-347064

(51) Int. Cl.⁷ ......................................... H01L 21/4763
(52) U.S. Cl. ...................... 438/624; 438/618; 438/622; 438/625; 438/626; 438/627; 438/628; 438/629; 438/633; 438/634; 438/642; 438/643; 438/645; 438/648; 438/652; 438/653; 438/656; 438/672; 438/685; 438/688
(58) Field of Search .............................. 438/618, 622, 438/624, 629, 633, 634, 642, 643, 645, 648, 652, 653, 656, 672, 685, 688

(56) References Cited

U.S. PATENT DOCUMENTS

| | | | |
|---|---|---|---|
| 5,275,963 A | * | 1/1994 | Cederbaum et al. .......... 437/48 |
| 5,578,523 A | | 11/1996 | Fiordalice et al. .......... 438/633 |
| 5,654,236 A | | 8/1997 | Kasai .......................... 438/639 |
| 5,882,999 A | | 3/1999 | Anderson et al. ........... 438/629 |

FOREIGN PATENT DOCUMENTS

| | | |
|---|---|---|
| JP | 62-216344 | 9/1987 |
| JP | 2-297935 | 12/1990 |
| JP | 3-263837 | 11/1991 |
| JP | 6-85075 | 3/1994 |
| JP | 7-240466 | 9/1995 |

\* cited by examiner

*Primary Examiner*—John F. Niebling
*Assistant Examiner*—David A. Zarneke
(74) *Attorney, Agent, or Firm*—Connolly Bove Lodge & Hutz, LLP

(57) ABSTRACT

A semiconductor device includes first and second conductive layers which are electrically connected to each other through a contact plug. A first insulating film is formed on the first conductive layer and has a first opening which reaches the surface of the first conductive layer. A second insulating film is formed on the first insulating film and has a second opening at the same position as the first opening. The contact plug is filled in the first and second openings and has the surface which is substantially flush with the surface of the second insulating film and also contains a metal having a high melting point. The second conductive layer is formed on the second insulating film and on the contact plug.

7 Claims, 11 Drawing Sheets

ELEMENT FORMATION REGION

SEMICONDUCTOR DEVICE AND FABRICATION METHOD THEREOF

This application is a divisional of application Ser. No. 09/039,454 filed Mar. 16, 1998, now abandoned.

BACKGROUND OF THE INVENTION

1. Field of the Invention

The present invention relates to a semiconductor device and a method for fabricating a semiconductor device, and more particularly, to a semiconductor device having a multilevel interconnection layer and a method for fabricating such a semiconductor device.

2. Description of the Related Art

In a conventional method for fabricating such a semiconductor device, a stopper film such as an Si3N4 layer is used which is smaller in a polishing rate than an interlevel insulating film, as disclosed in JP-A-62-216344, for example. That is, an aluminum layer is formed through the stopper film on the interlevel insulating film in which an electrode window is formed. Thereafter, the aluminum layer is polished to be buried in the electrode window.

However, as more miniaturization and higher integration of a semiconductor element are advanced, it has become necessary to reduce the parasitic resistance and capacitance within an opening such as a contact hole or a via hole. To this end, there has been developed a method for filling into the opening a conductive plug which is made of a metal having a high melting point. More specifically, a high-melting-point metallic layer made of tungsten (W) or the like is formed on the entire surface of the semiconductor substrate including the inner wall of the opening through an underlying conductive layer made of Ti, TiN or the like. Thereafter, the high-melting-point metallic layer is subjected to the anisotropic etching process to be buried only into the opening, so that the conductive plug is formed. Then, an upper wiring layer made of aluminum alloy or the like is patterned so as to be connected with the conductive plug. However, such a method for forming the conductive plug has a disadvantage that, when the high-melting-point metallic layer is subjected to the anisotropic etching process, the metallic layer within the opening tends to be excessively etched, so that a recess takes place in the conductive plug. This involves such a problem that the recess causes the reduction of step coverage of the upper wiring layer, whereby the upper wiring layer tends to be more broken and a resultant semiconductor device is reduced in its reliability.

For the purpose of solving the problem, a method for fabricating a semiconductor device as disclosed in JP-A-7-240466, for example is proposed that a stopper film such as an Si3N4 film is formed on an interlevel insulating film and then a contact hole is formed in the stopper and interlevel insulating films. Thereafter, a tungsten plug film is covered on the stopper film including the contact hole. After that, the tungsten plug film is subjected to an etch-back process until the stopper film is exposed, so that the stopper film is removed. This prevents a recess from taking place in the tungsten plug. In such a method for fabricating a semiconductor device, however, the occurrence of the recess in the tungsten plug can be avoided, but the surface of the tungsten plug is extruded from the surface of the interlevel insulating film, so that it is impossible to perfectly prevent the upper wiring layer, which is formed on the interlevel insulating film and is connected to the tungsten plug, from being broken.

SUMMARY OF THE INVENTION

An object of the present invention is to provide a semiconductor device which can secure a sufficient reliability in the semiconductor device and can reduce the parasitic resistance and capacitance within an opening, and a method for fabricating such a semiconductor device.

In accordance with the first aspect of the present invention, the above object is attained by providing a semiconductor device which comprises: first and second conductive layers electrically connected to each other through a contact plug; a first insulating film formed on the first conductive layer and having a first opening reaching a surface of the first conductive layer; and a second insulating film formed on the first insulating film and having a second opening formed at the same position as the first opening, wherein the contact plug is filled within the first and second openings, has a surface substantially flush with a surface of the second insulating film, and contains a metal having a high melting point; and the second conductive layer is formed on the surface of the second insulating film and a surface of the contact plug.

In accordance with the second aspect of the present invention, there is provided a semiconductor device which comprises: first and second conductive layers electrically connected to each other through a contact plug; a first insulating film formed on the first conductive layer and having a first opening reaching a surface of the first conductive layer; a second insulating film formed on the first insulating film and having a second opening formed at the same position as the first opening; and an underlying conductive layer formed on bottom and side faces of the first opening and on a side face of the second opening, wherein the contact plug is filled within the first and second openings through the underlying conductive layer and has a surface substantially flush with a surface of the second insulating film; and the second conductive layer is formed on the surface of the second insulating film and a surface of the contact plug.

In accordance with the third aspect of the present invention, there is provided a method for fabricating a semiconductor device having first and second conductive layers electrically connected to each other through a contact plug, which comprises the steps of: forming a first insulating film on the first conductive layer; forming a second insulating film on the first insulating film; forming first and second openings, which expose a part of a surface of the first conductive layer, in the first and second insulating films, respectively: forming a high-melting-point metallic layer containing a metal having a high melting point on the second insulating film so as to bury the first and second openings; forming the contact plug by polishing the high-melting-point metallic layer using the second insulating film as a stopper film to leave the high-melting-point metallic layer within the first and second openings; and forming the second conductive layer on a surface of the second insulating film and a surface of the contact plug.

In accordance with the fourth aspect of the present invention, there is provided a method for fabricating a semiconductor device having first and second conductive layers electrically connected to each other through a contact plug, which comprises the steps of: forming a first insulating film on the first conductive layer; forming a second insulating film on the first insulating film; forming first and second openings, which expose a part of a surface of the first conductive layer, in the first and second insulating films, respectively; forming an underlying conductive layer on bottom and side faces of the first opening and on a side face of the second opening; forming a third conductive layer on the underlying conductive layer and the second insulating film so as to bury the first and second openings; forming the contact plug by polishing the third conductive layer using the second insulating film as a stopper film to leave the third conductive layer within the first and second openings; and forming the second conductive layer on a surface of the second insulating film and a surface of the contact plug.

In accordance with the fifth aspect of the present invention, there is provided a method for fabricating a semiconductor device having first and second conductive layers electrically connected to each other through a contact plug, which comprises the steps of: forming an insulating film on the first conductive layer; forming an opening, which exposes a part of a surface of the first conductive layer, in the insulating film; forming an underlying conductive layer on bottom and side faces of the opening and on the insulating film; forming a high-melting-point metallic layer containing a metal having a high melting point on the second insulating film so as to bury the opening; forming the contact plug by subjecting the high-melting-point metallic layer to an etch back process using the insulating film as a stopper film to leave the high-melting-point metallic layer within the opening; subjecting the insulating film to an etch back process by a preset amount in such a manner that a surface of the contact plug is substantially flush with a surface of the insulating film; and forming the second conductive layer on a surface of the insulating film and the surface of the contact plug.

In accordance with the sixth aspect of the present invention, there is provided a method for fabricating a semiconductor device having first and second conductive layers electrically connected to each other through a contact plug, which comprises the steps of: forming a first insulating film on the first conductive layer; forming a second insulating film on the first insulating film; forming a third insulating film having a preset thickness on the second insulating film; forming first to third openings, which expose a part of a surface of the first conductive layer, in the first to third insulating films, respectively; forming an underlying conductive layer on bottom and side faces of the first opening, on a side face of the second opening and on the third insulating film; forming a high-melting-point metallic layer containing a metal having a high melting point on the underlying conductive layer so as to bury the first to third openings; forming the contact plug by subjecting the high-melting-point metallic layer to an etch back process using the third insulating film as a stopper film to leave the high-melting-point metal within the first to third openings; removing the third insulating film by subjecting the third insulating film to an etch back process; and forming the second conductive layer on a surface of the second insulating film and a surfaces of the contact plug.

In accordance with the seventh aspect of the present invention, there is provided a semiconductor device which comprises first and second conductive layers electrically connected to each other through a contact hole; a first insulating film formed on the first conductive layer and having a first opening reaching a surface of the first conductive layer; a second insulating film formed on the first insulating film and having a second opening formed at the same position as the first opening, the second insulating film having an etching rate smaller than an etching rate of the first insulating film; a third insulating film formed on the second insulating film and having a groove, the groove being formed at a position of the first and second openings so as to expose a part of the second insulating film, the groove having a width larger than a diameter of the first or second opening; and an underlying conductive layer formed on the part of the exposed second insulating film and on side faces of the groove of the third insulating film, the underlying conductive layer containing a metal having a high melting point, wherein the contact hole includes the first and second openings, the second conductive layer fills the contact hole and also fills the groove of the third insulating film through the underlying conductive layer.

DESCRIPTION OF THE PREFERRED EMBODIMENTS (Semiconductor Device according to First Embodiment and Method for Fabricating Semiconductor Device According to First Embodiment)

Figure 1:
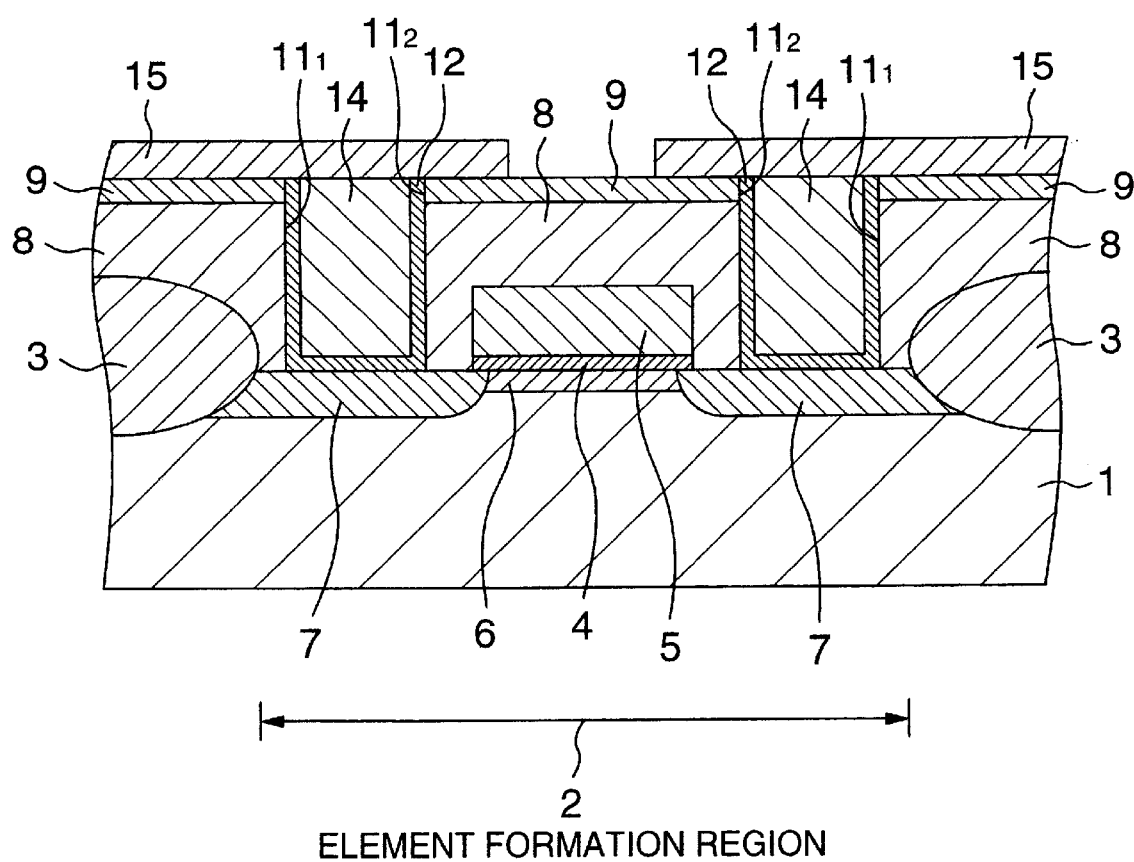
FIG. 1 is a cross-sectional view of a structure of a MOS transistor as a semiconductor device in accordance with a first embodiment of the present invention.

A semiconductor device in accordance with a first embodiment of the present invention is a MOS transistor having a multilevel interconnection layer, which includes, as shown in FIG. 1, a P-type silicon semiconductor substrate 1; a field oxidation film 3 for defining an element formation region 2; a gate oxidation film 4 formed on the silicon semiconductor substrate 1; a gate electrode 5 formed on the gate oxidation film 4; a P-type impurity layer 6 formed in the silicon semiconductor substrate 1 below the gate oxidation film 4; N-type impurity diffusion layers 7 (first conductive layers) formed at both sides of the P-type impurity layer 6 in the silicon semiconductor substrate 1; an interlevel insulating film 8 formed on the entire surface of the silicon semiconductor substrate 1 and having first contact holes $11_1$ on the impurity diffusion layers 7, respectively; a silicon nitride film 9 formed on the interlevel insulating film 8 and having second contact holes $11_2$ on the first contact holes $11_1$, respectively; underlying conductive films 12 each of which is formed on the side and bottom faces of the first contact hole $11_1$ and on the side faces of the second contact hole $11_2$ and is a TiW film, a double-layered film of Ti and TiN layers, a double-layered film of Ti and TiW layers or the like; tungsten plugs 14 each of which has the surface substantially flush with the surface of the silicon nitride film 9 and is buried into the first and second contact holes $11_1$ and $11_2$, and wiring layers 15 (second conductive layers) of aluminum alloy or the like each of which is formed on the silicon nitride film 9 to be electrically connected to the tungsten plug 14. The silicon nitride film 9 functions as a stopper film when the tungsten plugs 14 are formed by a chemical mechanical polishing (CMP) process. The first and second contact holes $11_1$ and $11_2$, the underlying conductive film 12, the tungsten plug 14 and the wiring layer 15 are formed on each of the two impurity diffusion layers 7.

In the semiconductor device of the present embodiment having such a structure, the tungsten plug 14 can be formed by the chemical mechanical polishing (CMP) process using the silicon nitride film 9 as the stopper film, so that the surface of the tungsten plug 14 can be substantially flush with the surface of the silicon nitride film 9. As a result, the wiring layer 15 can be prevented from being broken to improve the reliability of the semiconductor device (MOS transistor). Further, as the tungsten plug 14 is used, the parasitic resistance and capacitance within the opening can be reduced. In addition, the tungsten plug 14 is buried in the first and second contact holes $11_1$, $11_2$ through the underlying conductive film 12 which is TiW film, a double-layered film of Ti and TiN layers, a double-layered film of Ti and TiW layers or the like, so that it is possible to improve the adhesion of the tungsten plug 14.

When it is unnecessary to take the parasitic resistance and capacitance within the opening into consideration too much, the tungsten plug 14 may be replaced by an aluminum plug including aluminum. Further, when it is unnecessary to take the adhesion of the tungsten plug 14 into account too much, the tungsten plug 14 may be formed without any intervention of the underlying conductive film 12.

In the MOS transistor shown in FIG. 1, the impurity diffusion layer 7 is electrically connected to the tungsten plug 14 through the tungsten plug 14. However, an underlying wiring layer (first conductive layer) and an upper wiring layer (second conductive layer) both of which are formed above the silicon semiconductor substrate 1 can be electrically interconnected through a contact plug with the same structure as the above, thus providing substantially the same effects as the above.

Explanation will next be made on a method for fabricating the MOS transistor shown in FIG. 1 (i.e. a method for fabricating a semiconductor device in accordance with a first embodiment of the present invention) by referring to FIGS. 2A to 2C and 3A to 3C.

Figure 2A:
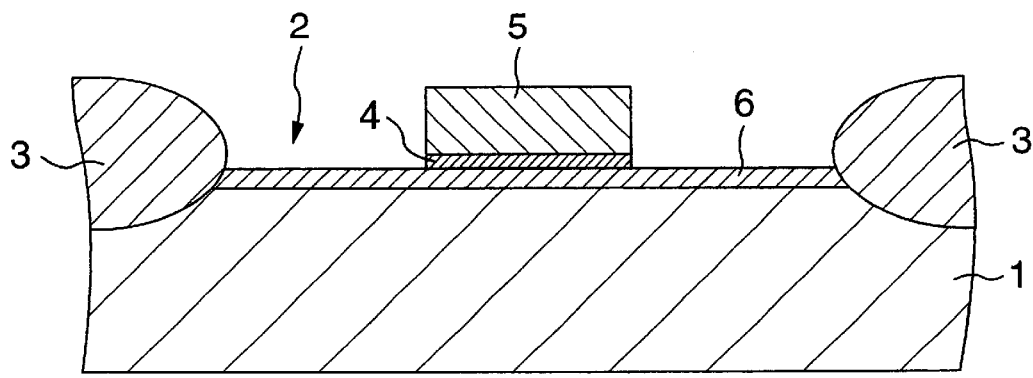
FIGS. 2A to 2C show cross-sectional views for explaining former steps in a method for fabricating the MOS transistor shown in FIG. 1.

In order to define the element formation region 2 of the element isolation structure, the field oxidation film 3 is, as shown in FIG. 2A, formed on the P-type silicon semiconductor substrate 1 by a so-called local oxidation of silicon (LOCOS) process. The P-type silicon semiconductor substrate 1 has a specific resistance of about $10\Omega/cm^2$, for example. Thereafter, boron ions (B) are implanted into the silicon semiconductor substrate 1 under conditions of a dose rate of about $1.0\times10^{12}$ to $2.0\times10^{12}/cm^2$ and an acceleration energy of about 15 to 30 keV to form the P-type impurity layer 6 at the element formation region 2.

Subsequently, the surface of the P-type impurity layer 6 is thermally oxidized to form a silicon oxidation film of about 15 nm thick, and then an impurity-doped polycrystalline silicon film of about 300 nm thick is formed by a chemical vapor deposition (CVD) process. Thereafter, the silicon oxide film and the polycrystalline silicon film are patterned by the photolithographic and dry etching processes to leave them in the shape of an electrode, so that the gate oxidation film 4 and the gate electrode 5 are formed at the element formation region 2.

Figure 2B:
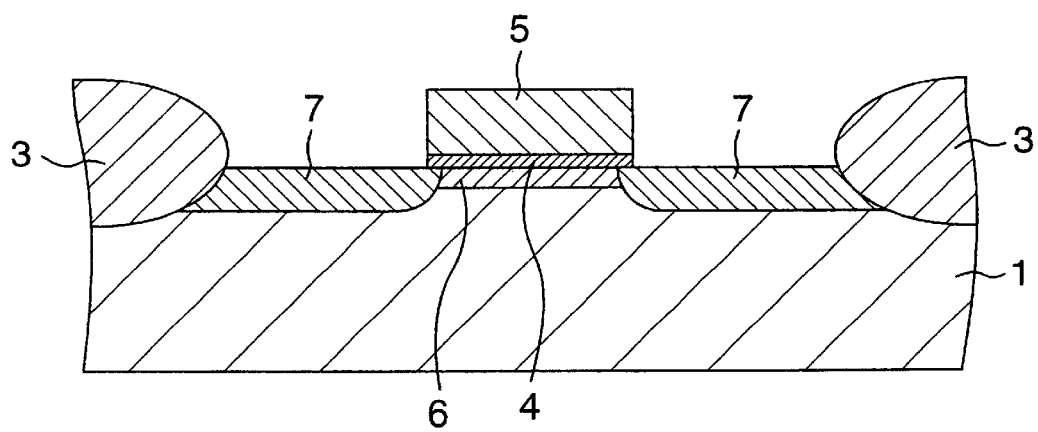

Subsequently, under conditions of a dose rate of about $1.0\times10^{12}$ to $2.0\times10^{12}/cm^2$ and an acceleration energy of about 10 to 30 keV, N-type impurity ions such as phosphorus (P) or arsenic (As) are implanted into the silicon semiconductor substrate 1 at the both sides of the gate electrode 5 using the gate electrode 5 as a mask. This results in that a pair of impurity diffusion layers 7 which function as the source and drain of the MOS transistor are formed, as shown in FIG. 2B.

Figure 2C:
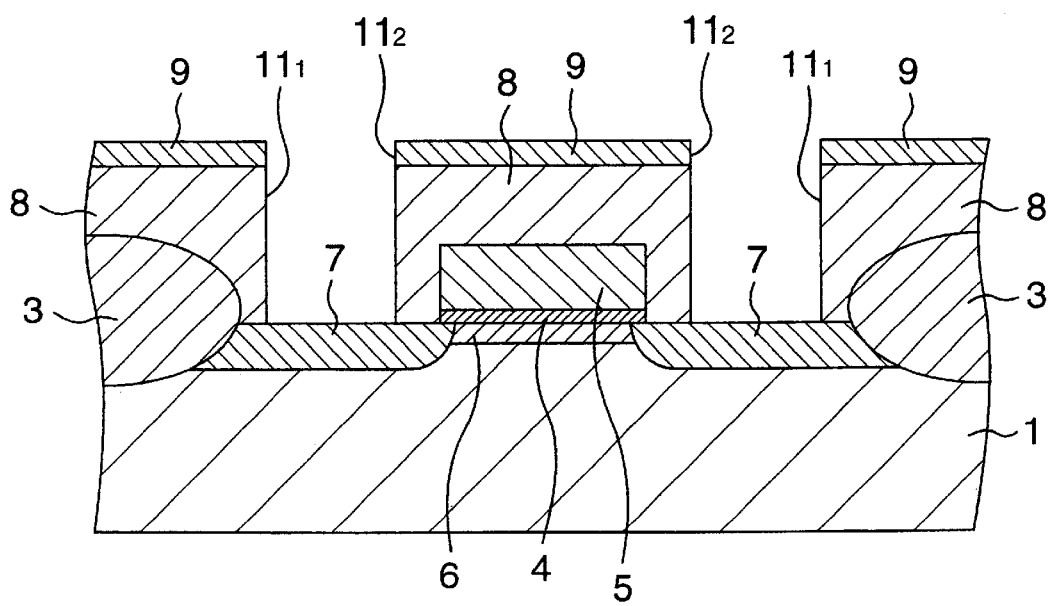

Subsequently, a silicon oxide film is formed on the entire surface of the silicon semiconductor substrate 1 including the field oxidation film 3 by the CVD process, so that the interlevel insulating film 8 of about 500nm thick is formed so as to bury the gate oxidation film 4 and the gate electrode 5, as shown in FIG. 2C. Thereafter, the silicon nitride film 9 is formed on the interlevel insulating film 8, and then the interlevel insulating film 8 and the silicon nitride film 9 are patterned to form the first and second contact holes $11_1$ and $11_2$, which expose a part of the surface of the impurity diffusion layer 7, in the interlevel insulating film 8 and the silicon nitride film 9, respectively. In this case, the first and second contact holes $11_1$ and $11_2$ are formed on each of the impurity diffusion layers 7.

Figure 3A:
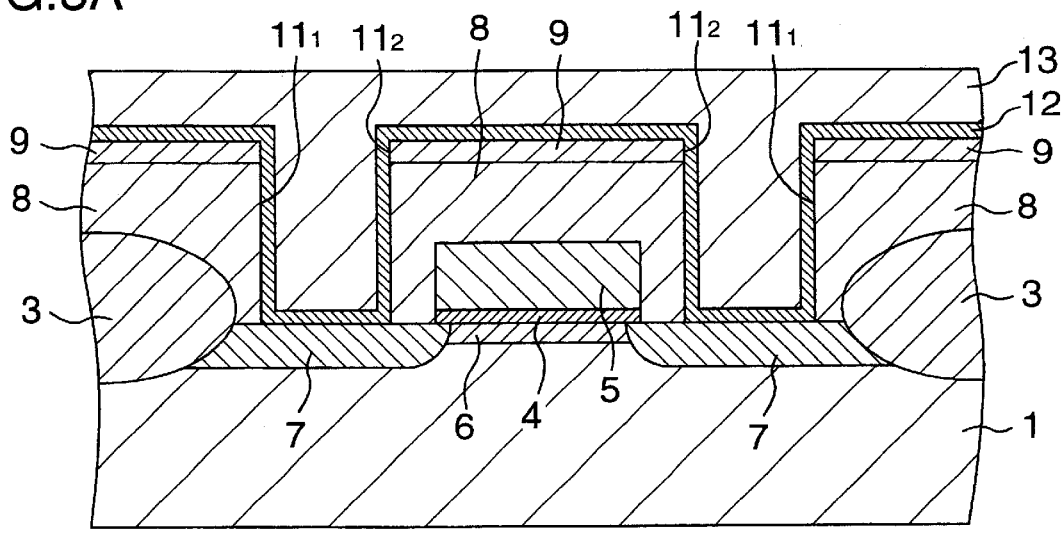
FIGS. 3A to 3C show cross-sectional views for explaining latter steps in the method for fabricating the MOS transistor of FIG. 1.

Subsequently, the underlying conductive film 12 is formed on the entire surface of the silicon semiconductor substrate 1 by the CVD process so as to cover the side and bottom faces of the first contact hole $11_1$ and the side face of the second contact hole $11_2$, as shown in FIG. 3A. The underlying conductive film 12 is a TiW film of about 100 nm thick or a double-layered film of a Ti layer of about 150 nm thick and a TiN layer of about 30 nm thick. Alternatively, the underlying conductive film 12 may be a double-layered film of TiW and TiN layers or a double-layered film of Ti and TiW layers. After that, the tungsten film 13 of about 600 nm thick is formed by the CVD process on the underlying conductive film 12 so as to bury the first and second contact holes 111 and 112.

Figure 3B:
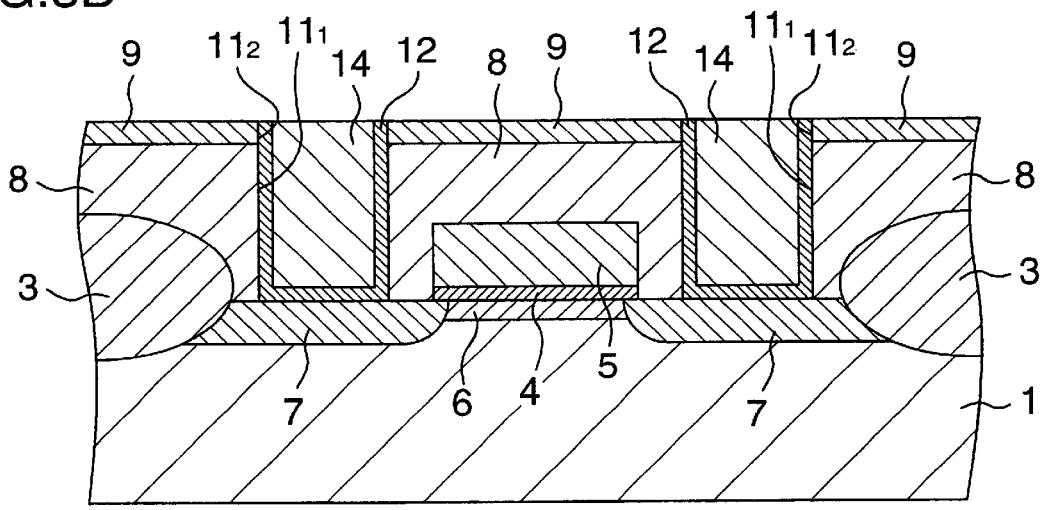

Subsequently, the tungsten film 13 is polished by the chemical mechanical polishing (CMP) process using the silicon nitride film 9 as a stopper. This causes the tungsten film 13 to be buried only within the first and second contact holes $11_1$ and $11_2$, so that the tungsten plugs 14 are formed, as shown in FIG. 3B. At this time, as the tungsten plugs 14 are formed by the chemical mechanical polishing (CMP) process, the generation of any recesses can be suppressed, so that the surfaces of the tungsten plugs 14 are substantially flush with the surface of the silicon nitride film 9.

Figure 3C:
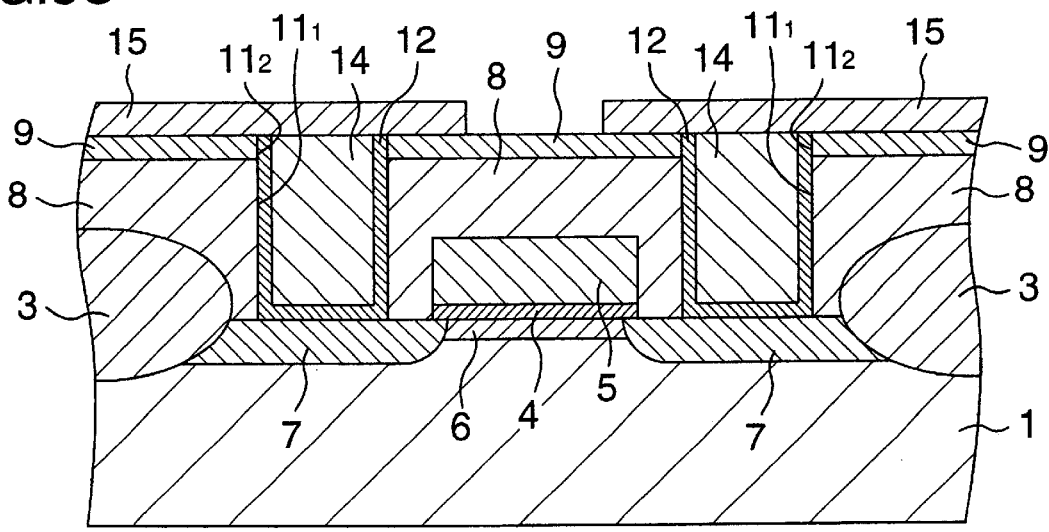

Subsequently, an aluminum alloy film is formed by the sputtering process on the entire surface of the silicon semiconductor substrate 1, and then is patterned by the photo-lithographic and dry etching processes. As a result, the striped-shaped wiring layers 15 each of which is electrically connected to the impurity diffusion layer 7 through the tungsten plug 14 is formed, as shown in FIG. 3C. At this time, as the surface of the tungsten plug 14 is substantially flush with the surface of the silicon nitride film 9, there can be fabricated the MOS transistor which can avoid the breakage of the wiring layer 15 and is high in its reliability.

Subsequently, the post steps of forming an interlevel insulating film and an wiring layer which function as a further upper layer are carried out to form the MOS transistor. The various thermal treatments carried out after the formation of the underlying conductive film 12 cause the interfaces between the underlying conductive film 12 and the impurity diffusion layers 7 to be formed into silicide, so that a silicide layer corresponding to the material of the underlying conductive film 12 is formed. For example, when there is a TiN film at the interface between the underlying conductive film 12 and the impurity diffusion layer 7, a titanium suicide layer is formed. When there is a TiW film at the interface between the underlying conductive film 12 and the impurity diffusion layer 7, a titanium tungsten silicide layer is formed.

(Method for Fabricating Semiconductor Device According to Second Embodiment)

Explanation will next be made on a method for fabricating a MOS transistor as an example of a method for fabricating a semiconductor device in accordance with a second embodiment of the present invention, with reference to FIGS. 4A–4C, 5A–5C and 6.

Figure 4A:
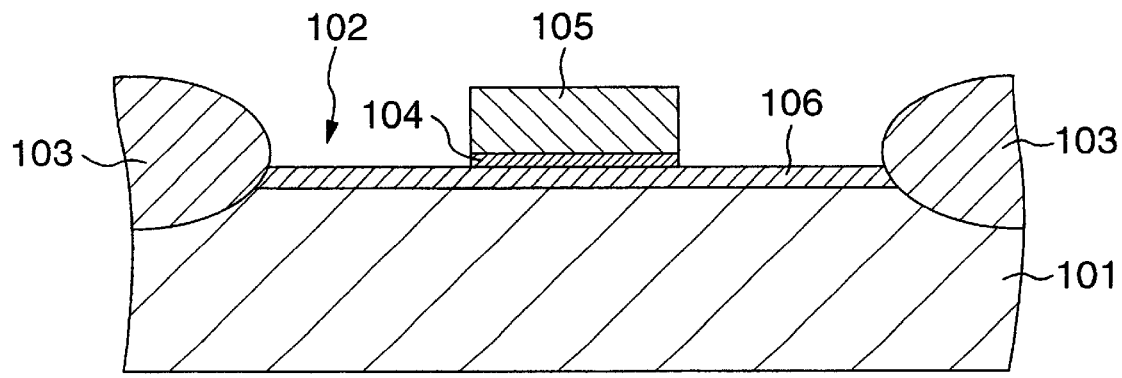
FIGS. 4A to 4C show cross-sectional views for explaining former steps in a method for fabricating a MOS transistor as a fabrication method in accordance with a second embodiment of the present invention.

In order to define an element formation region 102 of an element isolation structure, a field oxidation film 103 is formed on a P-type silicon semiconductor substrate 101 by a so-called local oxidation of silicon (LOCOS) process, as shown in FIG. 4A. The silicon semiconductor substrate 101 has a specific resistance of about $10\Omega/cm^2$, for example. Thereafter, boron (B) ions are implanted into the silicon semiconductor substrate 101 under conditions of a dose rate of about $1.0 \times 10^{12}$ to $2.0 \times 11^{12}/cm^2$ and an acceleration energy of about 15 to 30 keV, so that a P-type impurity layer 106 is formed at the element formation region 102.

Subsequently, the P-type impurity layer 106 is thermally oxidized to form a silicon oxide film of about 15 nm thick, and then an impurity-doped polycrystalline silicon film of about 300 nm thick is formed by the CVD process. Thereafter, the silicon oxide film and the polycrystalline silicon film are patterned by the photolithographic and dry etching processes to leave them in a shape of electrode, so that a gate oxidation film 104 and a gate electrode 105 are formed at the element formation region 102.

Figure 4B:
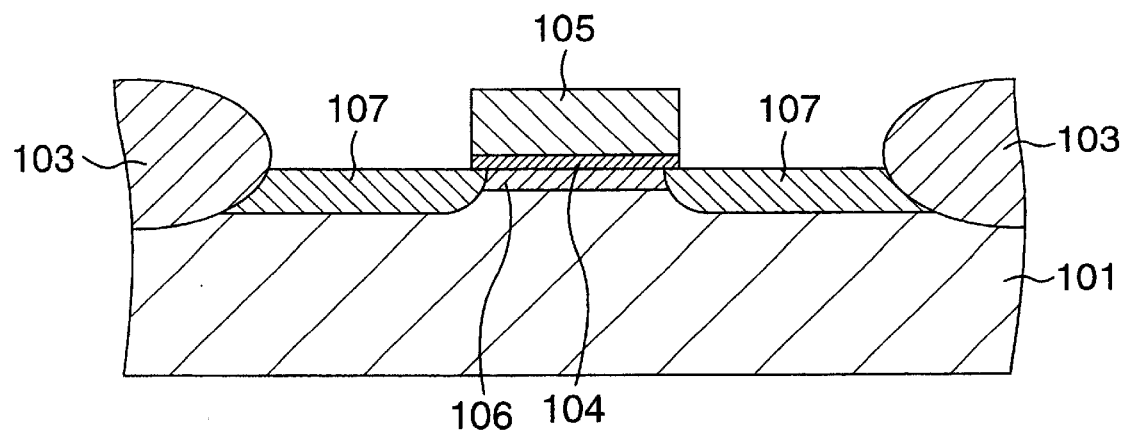

Under conditions of a dose rate of about $1.0 \times 10^{12}$ to $2.0 \times 10^{12}/cm^2$ and an acceleration energy of about 10 to 30 keV, N-type impurities such as phosphorus (P) or arsenic (As) arsenic (As) are implanted into the silicon semiconductor substrate 101 at both sides of the gate electrode 105 using the gate electrode 105 as a mask. This results in formation of a pair of impurity diffusion layers 107 which function as a source and drain of the MOS transistor, as shown in FIG. 4B.

Figure 4C:
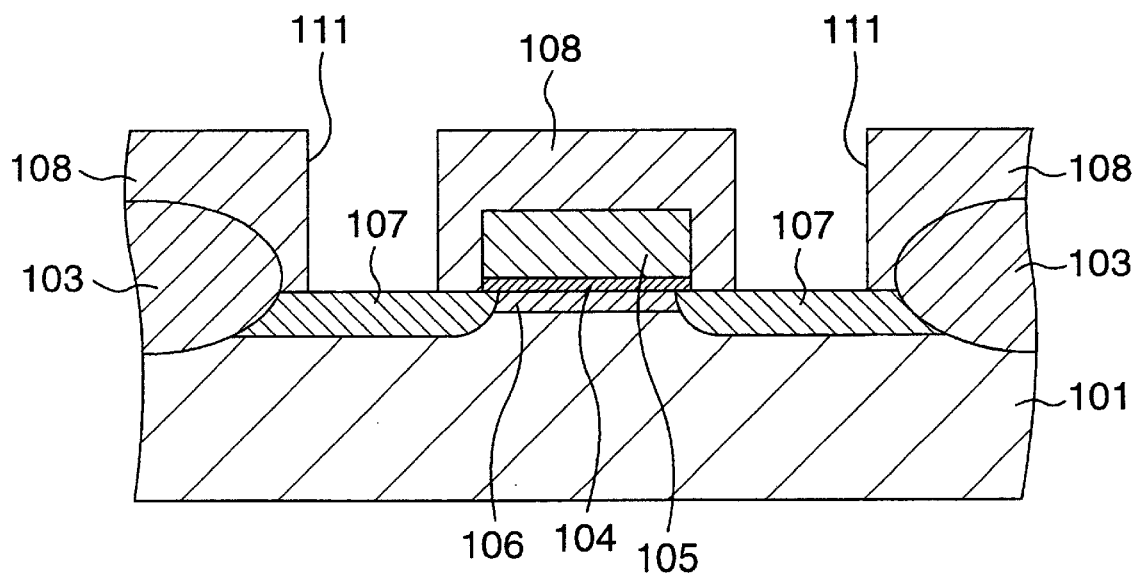

Subsequently, a silicon oxide film is formed on the entire surface of the silicon semiconductor substrate 101 including the field oxidation film 103 by the CVD process, whereby an interlevel insulating film 108 of about 500 nm thick is formed so as to bury the gate oxidation film 104 and the gate electrode 105, as shown in FIG. 4C. Then, the interlevel insulating film 108 is patterned to form contact holes 111 each of which exposes a part of the surface of the impurity diffusion layer 107. In the illustrated example, the contact holes 111 are formed on the pair of impurity diffusion layers 107, respectively.

Figure 5A:
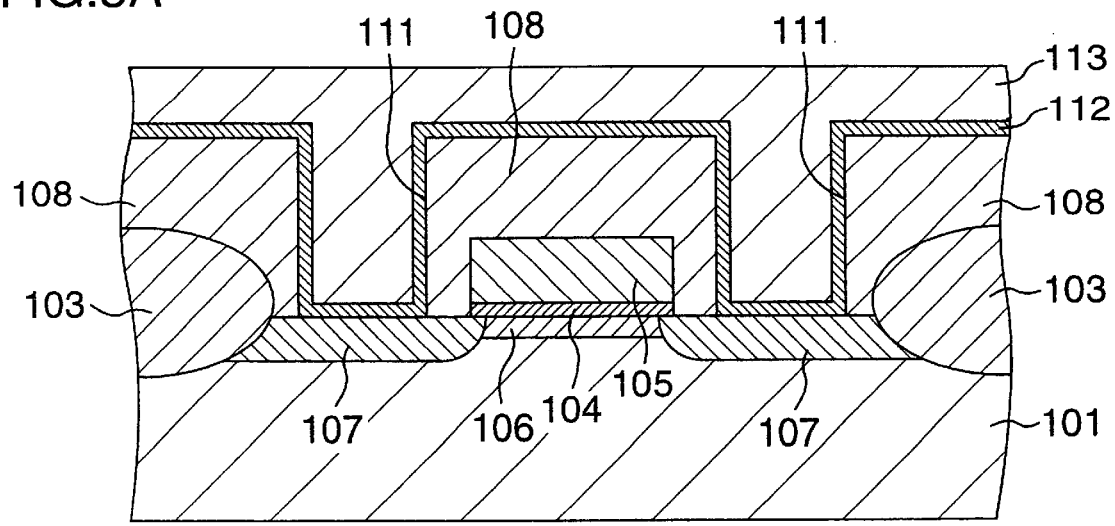
FIGS. 5A to 5C show cross-sectional views for explaining latter steps in the method for fabricating the MOS transistor as the fabrication method in accordance with the second embodiment of the present invention.

Subsequently, an underlying conductive layer 112 is formed by the CVD process on the entire surface of the silicon semiconductor substrate 101 so as to cover the side and bottom faces of the contact holes 111, as shown in FIG. 5A. The underlying conductive layer 112 is a TiW film of about 100 nm thick or a double-layered film of a Ti layer of about 150 nm thick and a TiN layer of about 30 nm thick. Alternatively, the underlying conductive layer 112 may be a double-layered film of TiW and TiN layers or a double-layered film of Ti and TiW layers. Then, a tungsten film 113 of about 400 nm thick is formed by the CVD process on the underlying conductive layer 112 so as to bury the contact holes 111.

Figure 5B:
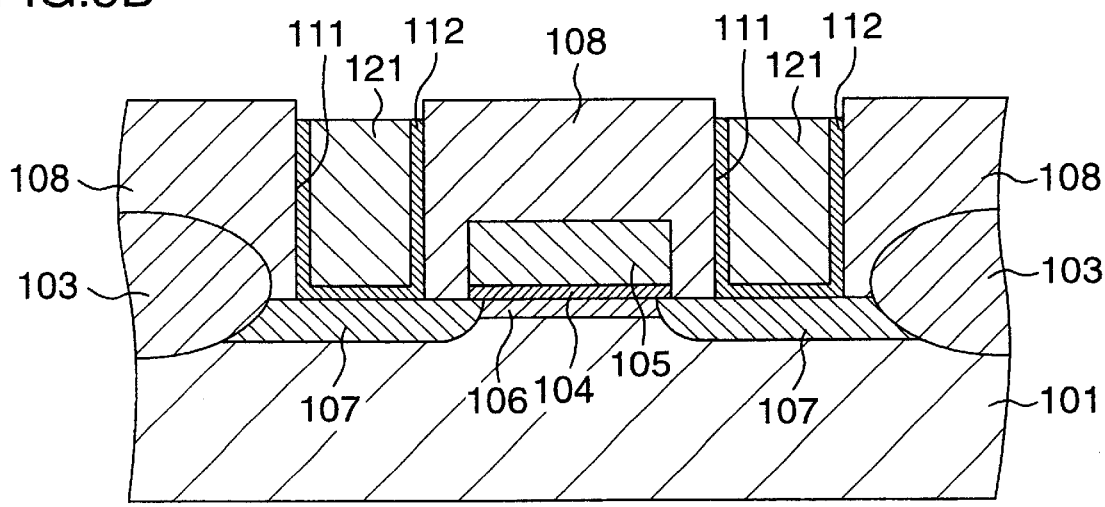
Figure 5C:
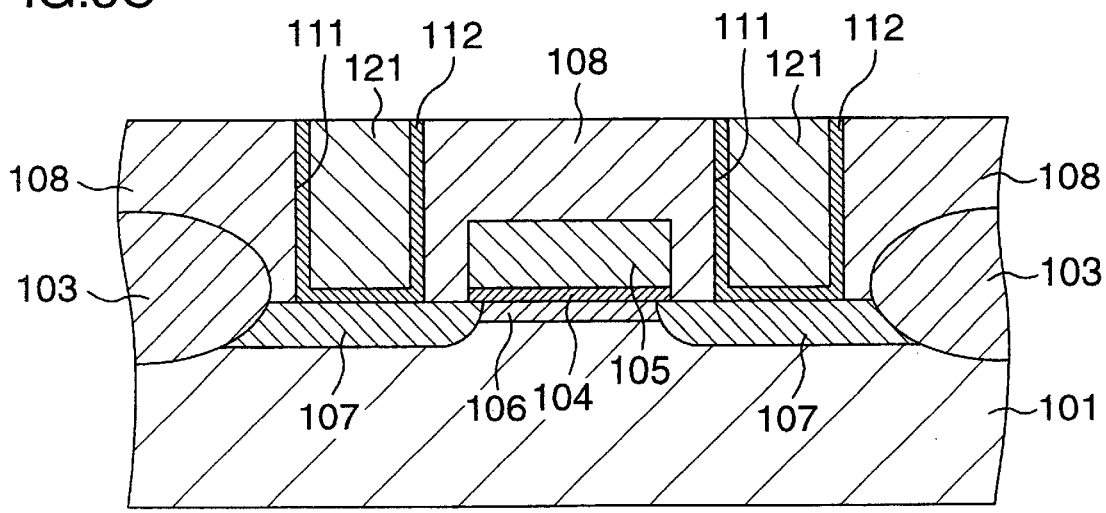

Subsequently, the tungsten film 113 is subjected to the anisotropic dry etching (etch back) process using the interlevel insulating film 108 as a stopper. As a result, the tungsten film 113 is buried into only the contact holes 111 to form tungsten plugs 121, as shown in FIG. 5B. At this time, when the etching is advanced to such an extent that the interlevel insulating film 108 is exposed, enchants are localized within the contact holes 111 so that an etching rate of the tungsten film 113 abruptly increases. This leads to the fact that the recess generation takes place and the surfaces of the tungsten plugs 121 become lower than the surface of the interlevel insulating film 108, that is, the contact plugs are recessed as shown in FIG. 5B. In order to remove such a recess, the following steps are carried out.

Only the interlevel insulating film 108 is subjected to the etch back process. In this connection, the amount of etch back in the interlevel insulating film 108 is set to be substantially equal to the amount of the recess generated in the contact plug (which recess amount is previously determined by the process used). For example, if the recess amount is about 100 nm, the etch back amount of the interlevel insulating film 108 is set to be about 100 nm. Thereby, the surfaces of the tungsten plugs 121 are substantially flush with the surface of the interlevel insulating film 108.

Figure 6:
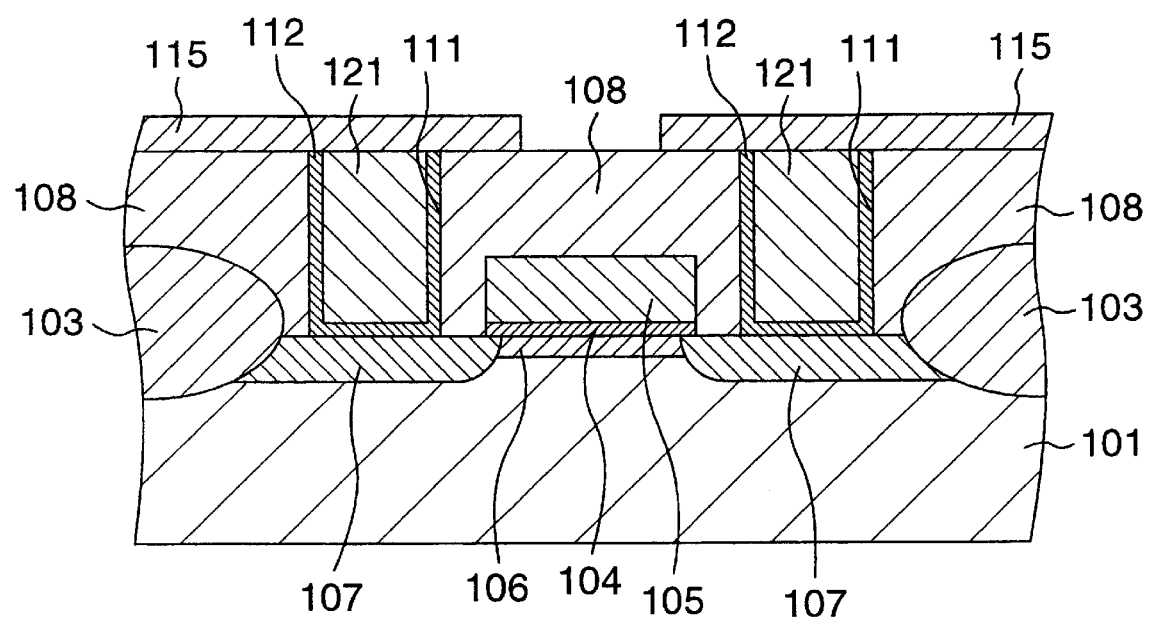
FIG. 6 shows a cross-sectional view for explaining the method for fabricating the MOS transistor as the fabrication method in accordance with the second embodiment of the present invention.

Subsequently, an aluminum alloy film is formed by the sputtering process on the entire surface of the silicon semiconductor substrate 101, and then is patterned by the photolithographic and dry etching processes. As a result, a pair of strip-shaped wiring layers 115, each of which is electrically connected to the impurity diffusion layer 107 through the tungsten plug 121, are formed, as shown in FIG. 6. In this case, since the surfaces of the tungsten plugs 121 are flush substantially with the surface of the interlevel insulating film 108, there can be fabricated the reliable MOS transistor which prevents the breakage of the wiring layer 115.

Subsequently, the post steps of forming an interlevel insulating film and an wiring layer which functions as a further upper layer are carried out to form the MOS transistor.

Each of the impurity diffusion layers 107 is electrically connected to the wiring layer 115 through the tungsten plug 121 in the aforementioned MOS transistor. However, even when lower and upper wiring layers, both of which are formed above the silicon semiconductor substrate 101, are electrically connected to each other through the contact plug with the same structure as the above, the present invention can produce substantially the same effects as the above.

(Method for Fabricating Semiconductor Device According to Third Embodiment)

By referring to FIGS. 7A–7C, 8A–8C and 9, explanation will be then made on a method for fabricating a MOS transistor as an example of a method for fabricating a semiconductor device in accordance with a third embodiment of the present invention.

Figure 7A:
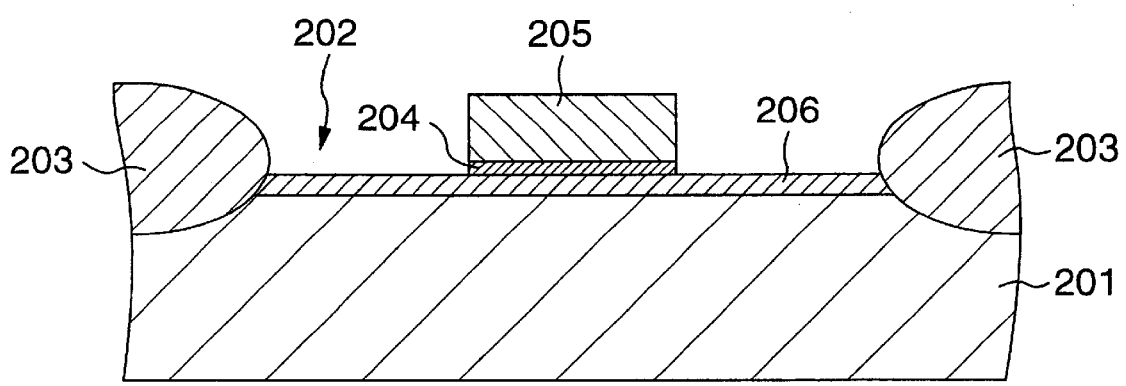
FIGS. 7A to 7C show cross-sectional views for explaining former steps in a method for fabricating a MOS transistor as a fabrication method in accordance with a third embodiment of the present invention.

For the purpose of defining an element formation region 202 of an element isolation structure, a field oxidation film 203 is formed on a P-type silicon semiconductor substrate 201 by the so-called local oxidation of silicon (LOCOS) process, as shown in FIG. 7A. The P-type silicon semiconductor substrate 201 has a specific resistance of about $10\times\Omega/cm^2$, for example. Thereafter, boron (B) ions are implanted into the silicon semiconductor substrate 201 under conditions of a dose rate of about $1.0\times10^{12}$ to $2.0\times10^{12}/cm^2$ and an acceleration energy of about 15 to 30 keV, so that a P-type impurity layer 206 is formed at the element formation region 202.

Subsequently, the P-type impurity layer 206 is thermally oxidized to form a silicon oxide film of about 15 nm thick. An impurity-doped polycrystalline silicon film of about 300 nm thick is formed by the CVD process. Then, the silicon oxide film and the polycrystalline silicon film are patterned by the photolithographic and dry etching processes to leave them in a shape of electrode, so that a gate oxidation film 204 and a gate electrode 205 are formed at the element formation region 202.

Figure 7B:
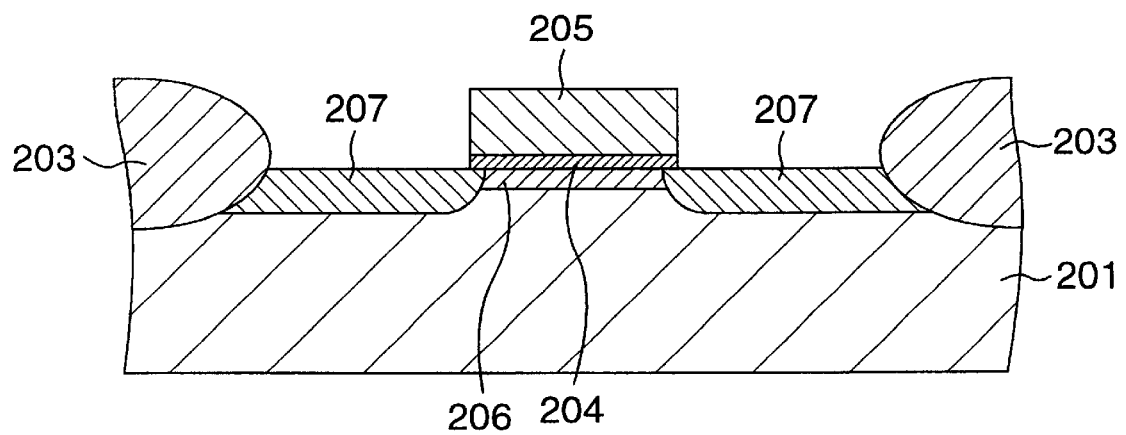

Subsequently, under conditions of a dose rate of about $1.0\times10^{12}$ to $2.0\times10^{12}/cm^2$ and an acceleration energy of about 10 to 30 keV, N-type impurities such as phosphorus (P) or arsenic (As) are implanted into the silicon semiconductor substrate 201 at both sides of the gate electrode 205 used as a mask. As a result, a pair of impurity diffusion layers 207 which function as source and drain of the MOS transistor are formed, as shown in FIG. 7B.

Figure 7C:
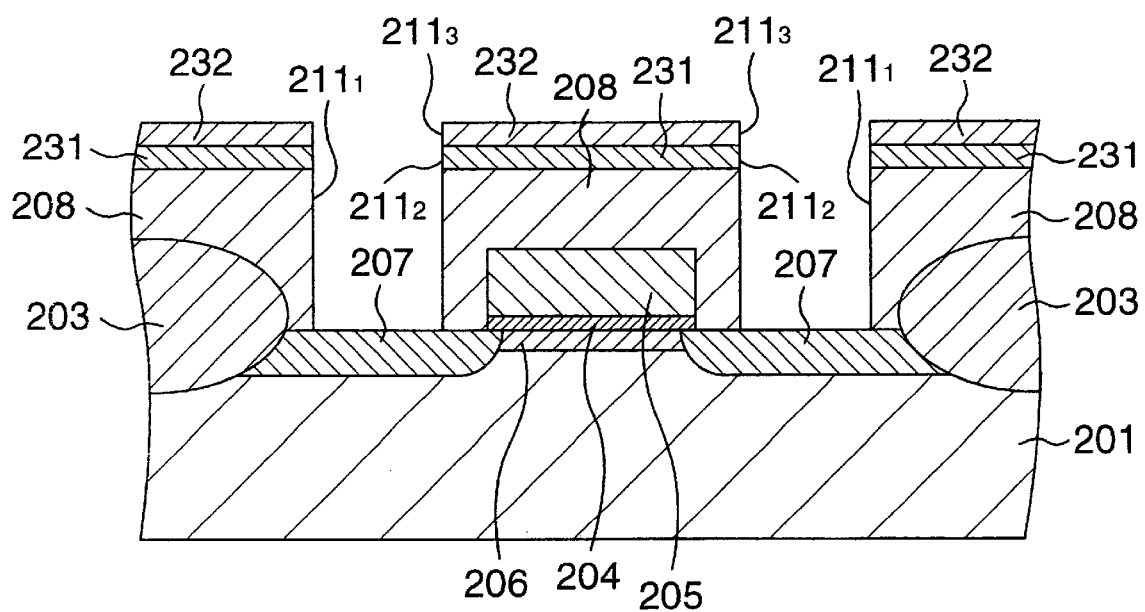

Subsequently, a silicon oxide film is formed by the CVD process on the entire surface of the silicon semiconductor substrate 201 including the field oxidation film 203, so that an interlevel isolating film 208 of about 500 nm thick is formed so as to bury the gate oxidation film 204 and the gate electrode 205, as shown in FIG. 7C. Thereafter, a silicon nitride film 231 of about 100 nm is formed on the interlevel isolating film 208, and then a silicon oxidation film 232 is formed on the silicon nitride film 231. In this conjunction, the thickness of the silicon oxidation film 232 is set to be substantially equal to the amount of recess (which amount is previously determined by the employed process) generated in a contact plug to be later formed in post steps. For example, if the recess amount is about 100 nm, the thickness of the silicon oxidation film 232 is also set to be about 100 nm. Thereafter, the interlevel isolating film 208, the silicon nitride film 231 and the silicon oxidation film 232 are patterned to form the first to third contact holes $2111$ to $2113$ in the interlevel isolating film 208, the silicon nitride film 231 and the silicon oxidation film 232, respectively. The first to third contact holes $2111$ to $2113$ expose a part of the surface of the impurity diffusion layer 207. In the illustrated example, the first to third contact holes $2111$ to $2113$ are formed on each of the impurity diffusion layers 207.

Figure 8A:
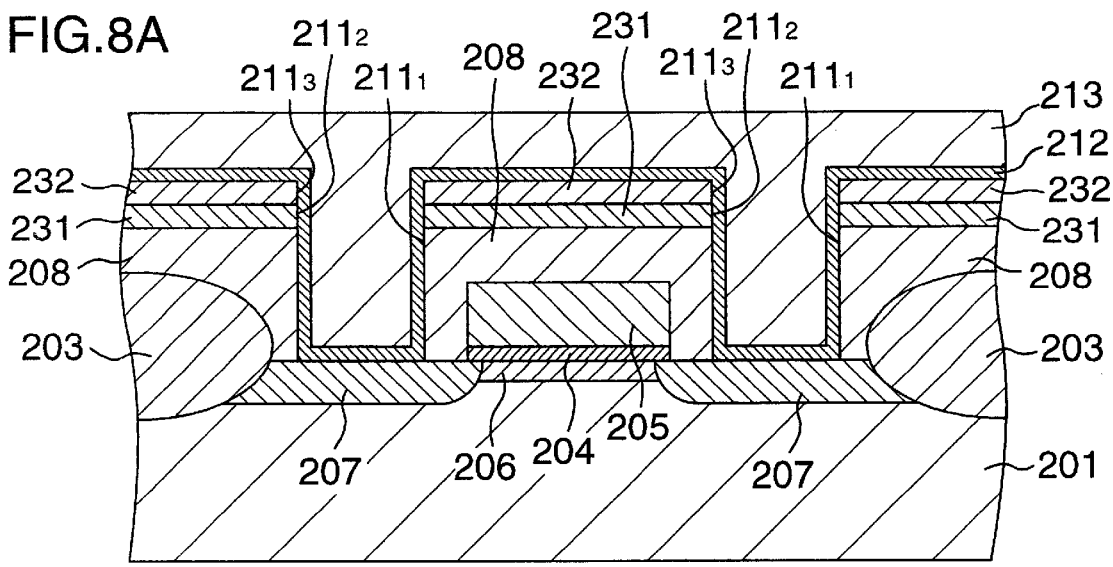
FIGS. 8A to 8C show cross-sectional views for explaining latter steps in the method for fabricating the MOS transistor as the fabrication method in accordance with the third embodiment of the present invention.

Subsequently, an underlying conductive layer 212 is formed on the entire surface of the silicon semiconductor substrate 201 by the CVD process so as to cover the side and bottom faces of the first contact hole $211_1$, the side face of the second contact hole $211_2$ and the side face of the third contact hole $211_3$, as shown in FIG. 8A. The underlying conductive layer 212 is a TiW film of about 100 nm thick or a double-layered film of Ti layer of about 150 nm thick and TiW layer of about 30 nm thick. Alternatively, the underlying conductive layer 212 may be a double-layered film of TiW and TiN layers or a double-layered film of Ti and TiW layers. Thereafter, a tungsten film 213 of about 400 nm thick is formed by the CVD process on the underlying conductive layer 212 so as to bury the first to third contact holes $211_1$ to $211_3$.

Figure 8B:
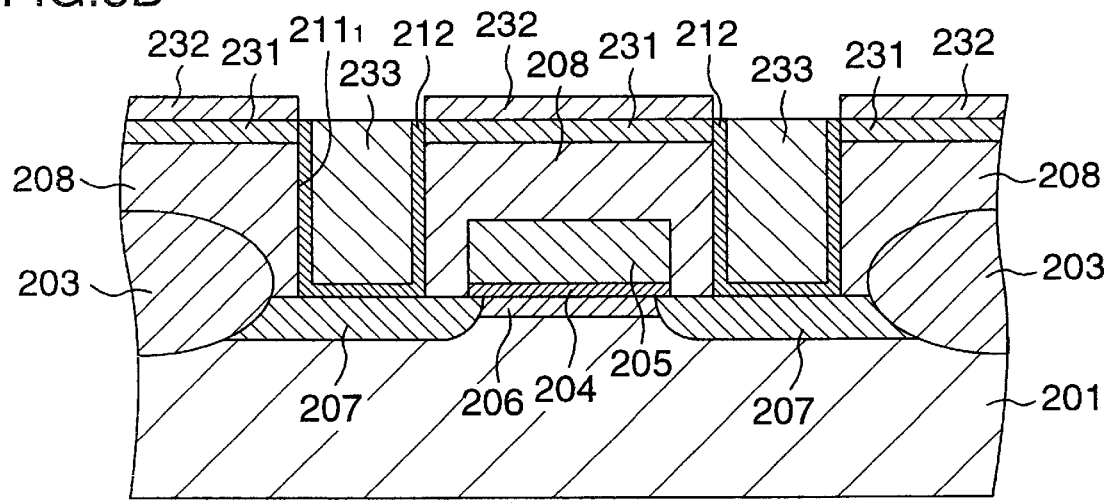
Figure 8C:
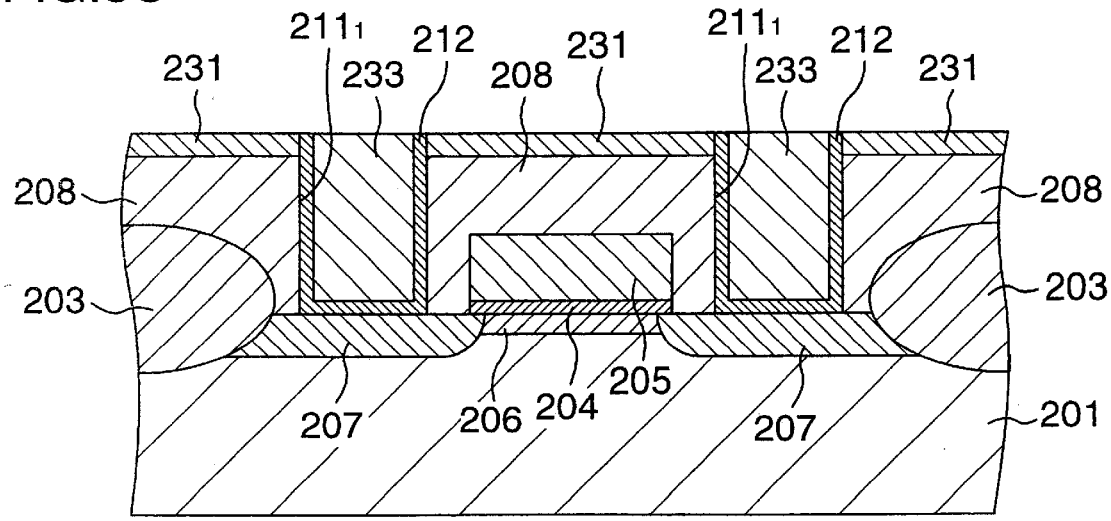

Subsequently, the tungsten film 213 is subjected to the anisotropic dry etching (etch back) process using the silicon oxidation film 232 as a stopper, so that the tungsten film 213 is buried into each of the contact holes to form tungsten plugs 233, as shown in FIG. 8B. At this time, when the etching is advanced to such an extent that the tungsten plug 233 is exposed, the etchant is localized within the contact holes and the etching rate of the tungsten film 213 abruptly increases. As a result, the recess is generated. That is, as shown in FIG. 8B, the surfaces of the tungsten plugs 233 are lower than the surface of the silicon oxidation film 232, or the contact plugs are recessed. In order to remove such a recess, the silicon oxidation film 232 is subjected to the etch back process. In this connection, since the thickness of the silicon oxidation film 232 is set to be substantially equal to the recess amount generated in the contact plug, the surfaces of the tungsten plugs 233 are substantially flush with the surface of the silicon nitride film 231 after the removal of the silicon oxidation film 232, as shown in FIG. 8C.

Figure 9:
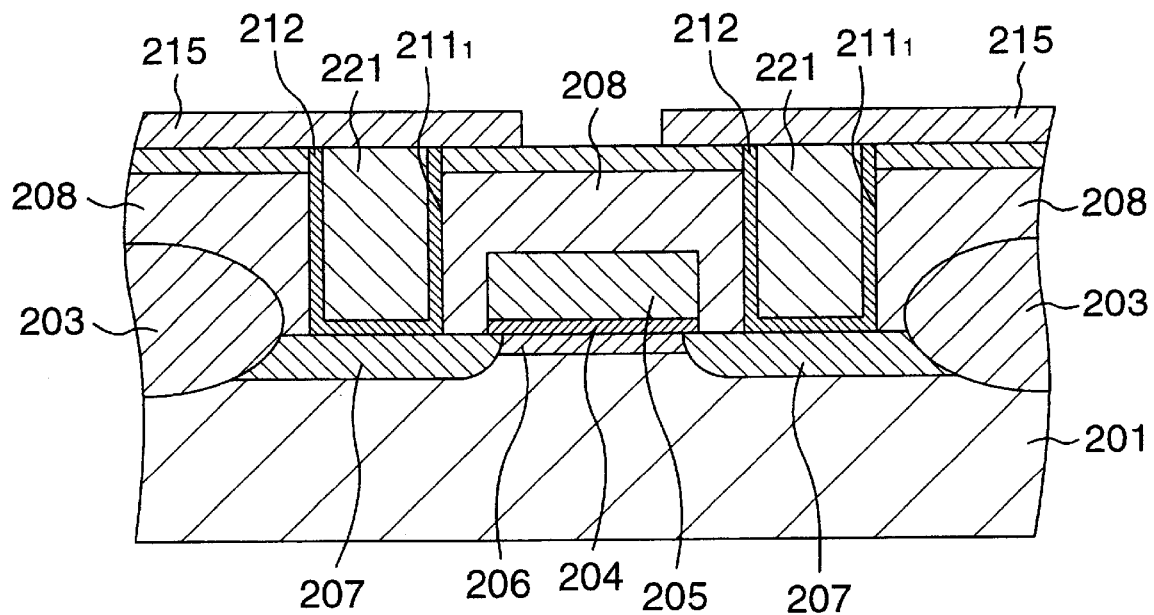
FIG. 9 is a cross-sectional view for explaining the method for fabricating the MOS transistor as the fabrication method in accordance with the third embodiment of the present invention.

Subsequently, an aluminum alloy film is formed by the sputtering process on the entire surface of the silicon semiconductor substrate 201, and then is patterned by the photolithographic and dry etching processes. As a result, strip-shaped wiring layers 215 each of which is electrically connected to the impurity diffusion layer 207 through the tungsten plug 233 are formed, as shown in FIG. 9. At this time, since the surfaces of the tungsten plugs 233 are substantially flush with the surface of the silicon nitride film 231, there can be fabricated the reliable MOS transistor which prevents the wiring layers 215 from being broken.

Further, post steps of forming an interlevel insulating film and a wiring layer both of which function as a further upper layer are carried out to thereby form the MOS transistor.

The impurity diffusion layer 207 is electrically connected to the wiring layer 215 through the tungsten plug 233 in the foregoing MOS transistor. However, even when the upper and lower wiring layers formed above the silicon semiconductor substrate 201 are electrically connected to each other through the contact plug with a similar structure to the above, the present invention can exhibit substantially the same effects as the above.

In the foregoing three semiconductor devices, the field oxidation film is used to have the element isolation structure. However, there may be used a conductive film of a field shield element isolation structure buried within the insulating film, in which a site of the silicon semiconductor substrate under the conductive film is fixed at a predetermined potential for the element isolation.

Further, the side-wall insulating film may be formed by forming a cap insulating film on the gate electrode and by leaving the silicon oxide film only at the side faces of the gate oxidation film, the gate electrode and the cap insulating film. In this case, the formation of the side-wall insulating film is carried out in the following manner. The photo-resist used for the patterning of the cap insulating film is removed by an ashing process, and then the silicon oxide film is formed by the CVD process on the entire surface of the silicon semiconductor substrate including the cap insulating film. Thereafter, the silicon semiconductor substrate is anisotropically etched to be left only at the side faces of the gate oxidation film, the gate electrode and the cap insulating film. In this manner, the side-wall insulating film made of the silicon oxide film can be formed.

Although the method for fabricating the MOS transistor is explained as an example, the present invention is not limited to the specific example but may be applied to such a semiconductor memory as EEPROM or DRAM or to such all semiconductor devices including a CMOS inverter that demands a high integration.

(Semiconductor Device according to Second Embodiment and Method for Fabricating Semiconductor Device According to Fourth Embodiment)

Figure 10:
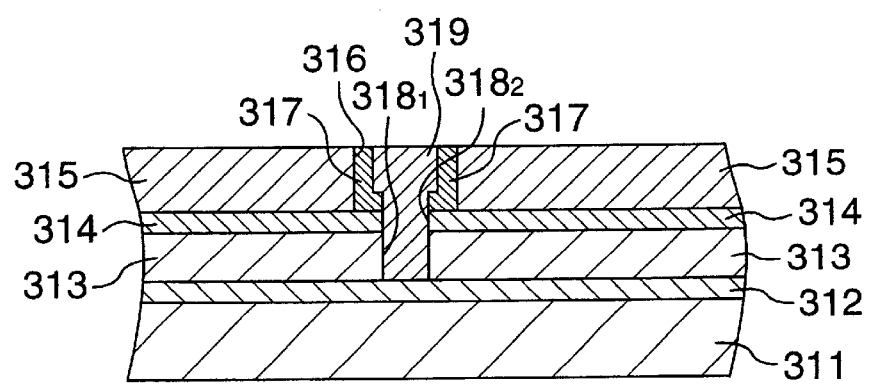
FIG. 10 is a cross-sectional view of a structure of the semiconductor device in accordance with a second embodiment of the present invention.

A semiconductor device in accordance with a second embodiment of the present invention includes, as shown in FIG. 10, a semiconductor substrate 311 having an element such as a transistor formed thereon; a lower wiring layer 312 (first conductive layer) formed on the semiconductor substrate 311; an insulating film 313 which is a double-layered of a plasma oxidation layer and a spin-on-glass (SOG) layer and is formed on the lower wiring layer 312 with a first contact hole $318_1$ formed therein; a silicon nitride film 314 which has an etching rate smaller than that of the insulating film 313 and is formed on the insulating film 313 with a second contact hole $318_2$ formed on the first contact hole 3181; a plasma oxidation film 315 which is formed on the silicon nitride film 314 with a wiring groove 316 formed on the second contact hole 3182; a titanium nitride film 317 (barrier metal layer) formed on the side and bottom faces of the groove 316 of the plasma oxidation film 315; and a copper film 319 (second conductive layer) formed within the first contact hole $318_1$ of the insulating film 313 and within the groove 316 of the plasma oxidation film 315 through the titanium nitride film 317. In the illustrated example, the groove 316 of the plasma oxidation film 315 is set to have a width larger than the diameter of the first or second contact hole $318_1$, $318_2$. Accordingly, the titanium nitride film 317 is formed on the silicon nitride film 314 at the bottom face of the groove 316.

In the semiconductor device of the present embodiment, as the copper film 319 is formed within the groove 316 of the plasma oxidation film 315 through the titanium nitride film 317 (barrier metal layer), the adhesion of the copper film 319 to the plasma oxidation film 315 can be increased in comparison with that when the copper film is formed directly within the groove 316 without any intervention of the titanium nitride film 317. As a result, the semiconductor device can be improved in its reliability. Further, as the copper film 319 is formed without any intervention of the titanium nitride film 317 within the first contact hole $318_1$ of the insulating film 313 and within the second contact hole $318_2$ of the silicon nitride film 314, the parasitic resistance and capacity of the first and second contact holes $318_1$ and $318_2$ can be minimized.

Although the titanium nitride film 317 is used as the barrier metal layer (underlying conductive layer) in the foregoing semiconductor device, the barrier metal layer may is made of at least one selected from the group of titanium, titanium compound, tungsten, tungsten compound, tantalum and tantalum compound. The copper film 319 is used as the second conductive layer. However, the second conductive layer may be made of at least one selected from the group of aluminum, aluminum alloy, copper and copper alloy.

In the semiconductor device shown in FIG. 10, further, the lower wiring layer 312 formed on the semiconductor substrate 311 and the copper film 319 formed above the semiconductor substrate 311 are electrically connected to each other through the contact plug. However, the impurity diffusion layer formed in the semiconductor substrate and the wiring layer formed above the semiconductor substrate may be electrically connected to each other through the contact plug with substantially the same structure as the above, the present invention can produce substantially the same effects as the above case.

Explanation will next be made on a method for fabricating the semiconductor device shown in FIG. 10 (the method for fabricating a semiconductor device in accordance with the fourth embodiment of the present invention), by referring to FIGS. 11A–11D and 12A–12D.

Figure 11A:
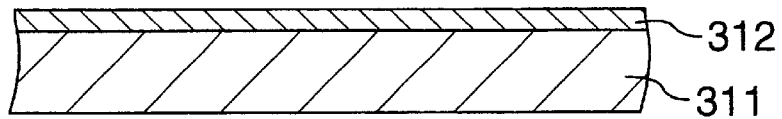
FIGS. 11A to 11D show cross-sectional views for explaining a method for fabricating the semiconductor device of FIG. 10.
Figure 11B:
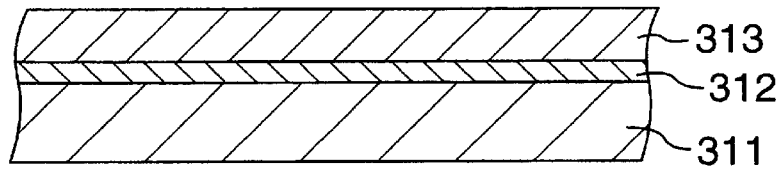
Figure 11C:
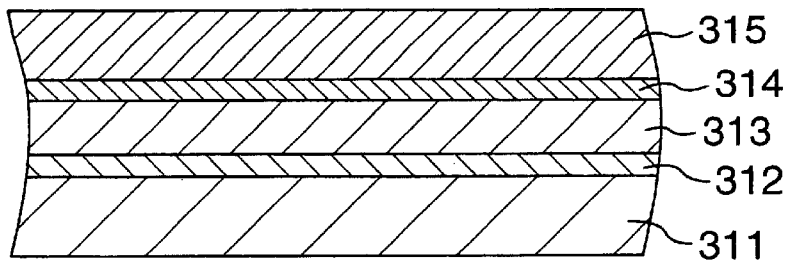

A titanium nitride film of about 100 nm thick and an aluminum alloy film of about 400 nm thick are formed on the semiconductor substrate 311, in which an element such as a transistor is formed, by the sputtering process. Thereafter, the titanium nitride film and the aluminum alloy film are patterned to form the lower wiring layer 312 on semiconductor substrate 311, as shown in FIG. 11A. Thereafter, the insulating film 313 of about 1000 nm thick, which is made of the plasma oxidation film and the SOG film, is formed on the lower wiring layer 312, as shown in FIG. 11B. As shown in FIG. 11C, the silicon nitride film 314 of about 20 nm thick is formed on the insulating film 313, and then the plasma oxidation film 315 of about 1000 nm thick is formed on the silicon nitride film 314.

Figure 11D:
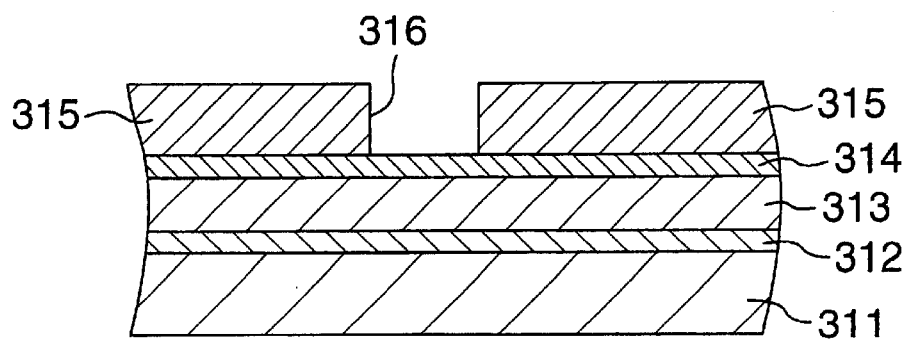
Figure 12A:
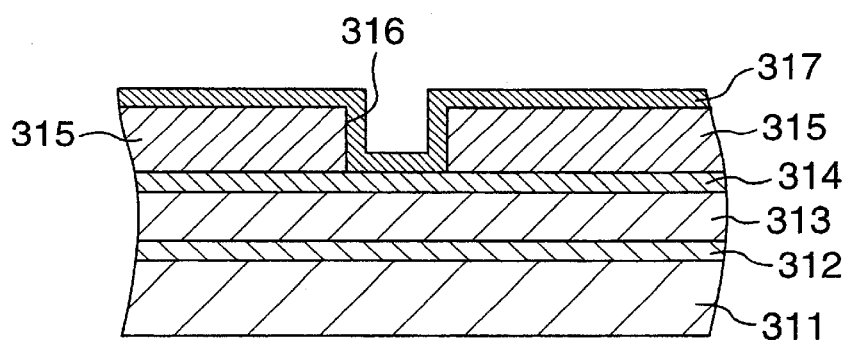
FIGS. 12A to 12D show cross-sectional views for explaining the method for fabricating the semiconductor device of FIG. 10.

Subsequently, the plasma oxidation film 315 is patterned by the photolithographic and dry etching processes to form the wiring groove 316 in the plasma oxidation film 315, as shown in FIG. 11D. At this time, when the silicon nitride film 314 is used as an etching stopper, the dry etching of the plasma oxidation film 315 is carried out until the silicon nitride film 314 is partially exposed at the region of the groove 316. After that, the titanium nitride film 317 of about 100 nm thick functioning as a barrier metal layer is formed on the bottom and side faces of the groove 316 and on the plasma oxidation film 315, as shown in FIG. 12A.

Figure 12B:
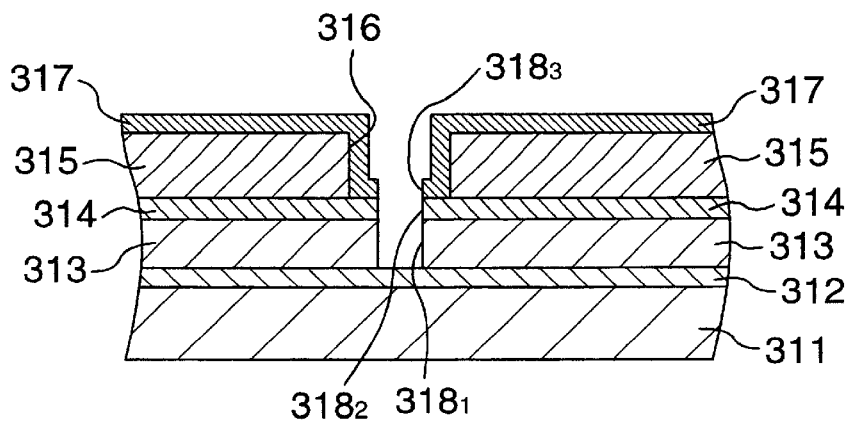

In order to expose the surface of the lower wiring layer 312 at the region of the groove 316, the first to third contact holes $318_1$ to $318_3$ are formed by the photolithographic and etching processes in the insulating film 313, the silicon nitride film 314 and the titanium nitride film 317, respectively. As a result, the via hole (contact hole) 318 of about 0.6 $\mu$m in diameter which is made of the first to third contact holes $318_1$ to $318_3$ is formed, as shown in FIG. 12B.

Figure 12C:
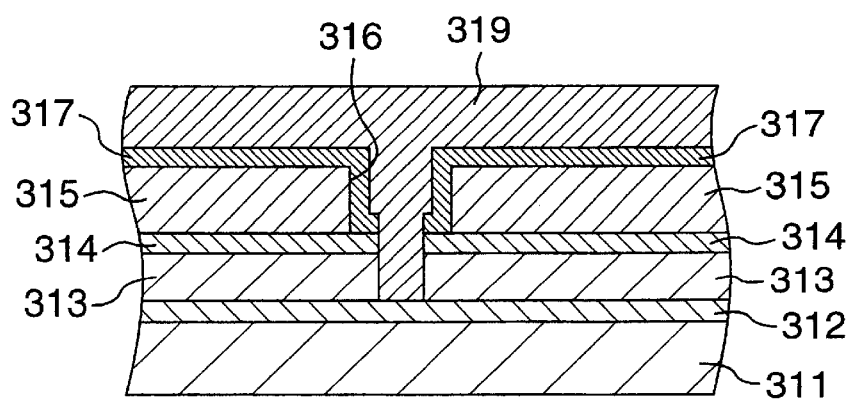
Figure 12D:
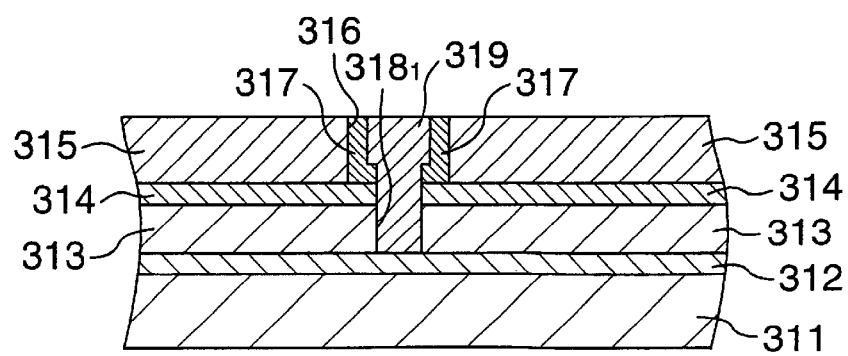

Subsequently, the copper film 319 is formed on the titanium nitride film 317 by the chemical vapor deposition (CVD) process using organic material so as to bury the via hole 318 and the groove 316, as shown in FIG. 12C. After that, the copper film 319 and the titanium nitride film 317 are polished by the chemical-mechanical polishing (CMP) process, for example, until the plasma oxidation film 315 is exposed. As a result, as shown in FIG. 12D, the contact plug and the upper wiring layer are formed. The contact plug is constituted of the copper film 319 which is formed within the via hole 318, and the titanium nitride film 317 and the copper film 319 both of which are formed within the groove 316. The upper wiring layer is constituted of the titanium nitride film 317 and the copper film 319 both of which are formed within the groove 316.

What is claimed is:

1. A method for fabricating a semiconductor device having first and second conductive layers which are electrically connected to each other through a contact plug, comprising the steps of:

forming a first insulating film on said first conductive layer;

forming a second insulating film on said first insulating film;

forming first and second openings, which exposes a part of a surface of said first conductive layer, in said first and second insulating films, respectively;

forming a high-melting-point metallic layer containing a metal having a high melting point on said second insulating film to bury said first and second openings;

forming said contact plug by polishing said high-melting-point metallic layer using said second insulating film as a stopper film to leave said high-melting-point metallic layer within said first and second openings; and forming said second conductive layer on a surface of said second insulating film and on a surface of said contact plug.

2. A method for fabricating a semiconductor device as set forth in claim 1, wherein said second insulating film is a silicon nitride film; and said contact plug is a tungsten plug containing tungsten.

3. A method for fabricating a semiconductor device as set forth in claim 1, wherein said first conductive layer is an impurity diffusion layer formed in a semiconductor substrate;

said first insulating film is an interlevel insulating film formed on said semiconductor substrate;

said second insulating film is a silicon nitride film formed on said interlevel insulating film;

said contact plug is a tungsten plug containing tungsten; and said second conductive layer is a wiring layer containing aluminum.

4. A method for fabricating a semiconductor device having first and second conductive layers electrically connected to each other through a contact plug, comprising the steps of:

forming a first insulating film on said first conductive layer;

forming a second insulating film on said first insulating film;

forming first and second openings, which exposes a part of a surface of said first conductive layer, in said first and second insulating films, respectively;

forming an underlying conductive layer at least on bottom and side faces of said first opening and on a side face of said second opening;

forming a third conductive layer on said underlying conductive layer and said second insulating film to bury said first and second openings;

forming said contact plug by polishing at least said third conductive layer using said second insulating film as a stopper film to leave said third conductive layer within said first and second openings; and forming said second conductive layer on a surface of said second insulating film and on a surface of said contact plug.

5. A method for fabricating a semiconductor device as set forth in claim 4, wherein said second insulating film is a silicon nitride film; and said third conductive layer is a tungsten layer containing tungsten.

6. A method for fabricating a semiconductor device as set forth in claim 4, wherein said second insulating film is a silicon nitride film;

said underlying conductive layer is a TiW film, a double-layered film of TiW and TiN layers, a double-layered film of Ti and TiN layers, or a double-layered film of Ti and TiW layers; and said third conductive layer is a tungsten layer containing tungsten.

7. A method for fabricating a semiconductor device as set forth in claim 4, wherein said first conductive layer is an impurity diffusion layer formed in a semiconductor substrate;

said first insulating film is an interlayer insulating film formed on said semiconductor substrate;

said second insulating film is a silicon nitride film formed on said interlayer insulating film;

said underlying conductive layer is a TiW film, a double-layered film of TiW and TiN layers, a double-layered film of Ti and TiN layers, or a double-layered film of Ti and TiW layers;

said third conductive layer is a tungsten layer containing tungsten; and said second conductive layer is a wiring layer containing aluminum.

* * * * *